United States Patent
Costello et al.

(10) Patent No.: US 7,531,826 B2
(45) Date of Patent: May 12, 2009

(54) PHOTOCATHODE STRUCTURE AND OPERATION

(75) Inventors: Kenneth A Costello, Alameda County, CA (US); Verle W. Aebi, San Mateo County, CA (US)

(73) Assignee: Intevac, Inc., Santa Clara, CA (US)

( * ) Notice: Subject to any disclaimer, the term of this patent is extended or adjusted under 35 U.S.C. 154(b) by 203 days.

(21) Appl. No.: 11/142,805

(22) Filed: Jun. 1, 2005

(65) Prior Publication Data

US 2007/0034987 A1 Feb. 15, 2007

(51) Int. Cl.
*H01L 29/06* (2006.01)
*H01L 29/12* (2006.01)
*H01L 27/04* (2006.01)
*H01J 40/06* (2006.01)
*G01J 5/20* (2006.01)

(52) U.S. Cl. .......................... 257/10; 257/11; 257/186; 250/338.4; 250/461.2; 313/542

(58) Field of Classification Search .................. 257/10, 257/11, 186; 313/542; 250/338.4, 461.2
See application file for complete search history.

(56) References Cited

U.S. PATENT DOCUMENTS

| 3,631,303 | A |   | 12/1971 | Antypas et al. |
|-----------|---|---|---------|----------------|
| 3,814,993 | A |   | 6/1974  | Kennedy        |
| 3,868,523 | A | * | 2/1975  | Klopfer et al. ............... 313/542 |
| 3,889,284 | A | * | 6/1975  | Schiel ......................... 257/186 |
| 4,119,994 | A | * | 10/1978 | Jain et al. .................... 257/198 |
| 4,724,354 | A |   | 2/1988  | Dill            |
| 5,047,821 | A |   | 9/1991  | Costello et al. |
| 5,268,570 | A |   | 12/1993 | Kim            |
| 5,576,559 | A |   | 11/1996 | Davis          |
| 5,597,112 | A |   | 1/1997  | Knapp          |
| 5,680,007 | A |   | 10/1997 | Niigaki et al. |
| 5,710,435 | A | * | 1/1998  | Niigaki et al. ................ 257/11 |
| 5,742,115 | A |   | 4/1998  | Gertsenshteyn  |
| 5,883,466 | A | * | 3/1999  | Suyama et al. ............... 313/542 |
| 5,923,045 | A | * | 7/1999  | Nihashi et al. ................ 257/10 |
| 6,121,612 | A | * | 9/2000  | Sinor et al. .................... 250/330 |
| 6,570,147 | B2 |  | 5/2003  | Smith          |
| 6,614,606 | B2 |  | 9/2003  | Jones          |
| 2004/0232403 | A1 | | 11/2004 | Sillmon et al. |

OTHER PUBLICATIONS

International Search Report for PCT/US06/20263 dated Apr. 4, 2008.
New Scientific Magazine Issue 2486.Feb. 12, 2005, p. 21 by Duncan Graham-Rowe.
NASA Technical Brief vol. 22 No. 12 NPO 20245: Minature, Tunable, Wide-Band-Pass Optical Filters, Dec. 1998.
Physical Review, vol. 112, p. 114 (1958) by William E Spicer: Photoemissive, Photoconductivity, and Optical Absorption Studies of Alkali-Antimony Compounds.
Applied Physics 12, 115-130 (1977) by William E Spicer: Negative Affinity 3-5 Photocathodes: Their Physics and Technology.

* cited by examiner

*Primary Examiner*—Shouxiang Hu
(74) *Attorney, Agent, or Firm*—Nixon Peabody LLP; Joseph Bach, Esq.

(57) ABSTRACT

A novel photocathode employing a rectifying junction is described that permits color imaging extending applications for photocathodes in a variety of instruments and night vision devices.

24 Claims, 8 Drawing Sheets

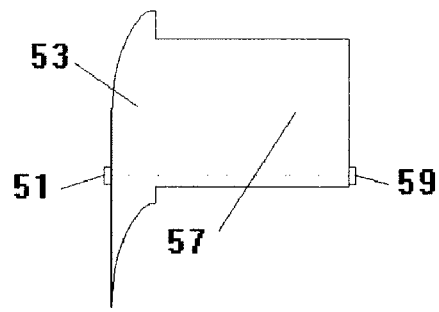
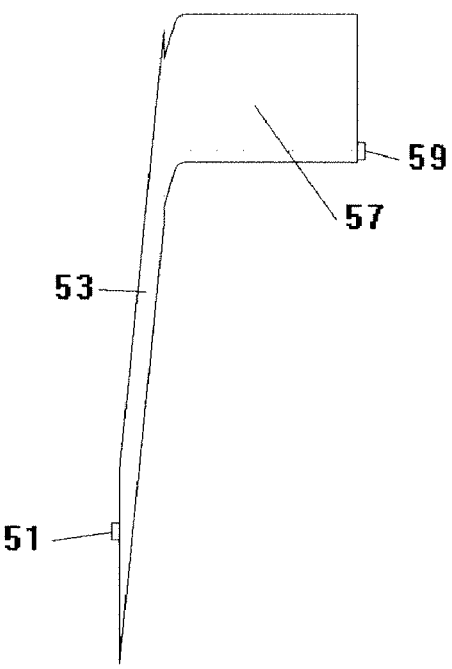
Figure 3A        Figure 3B
Figure 3
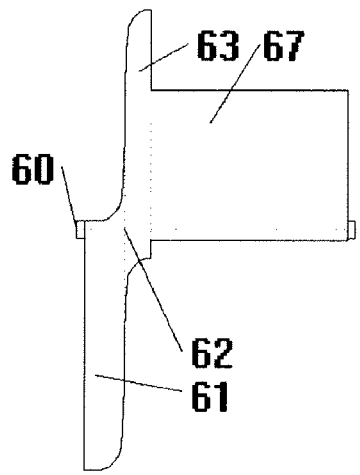
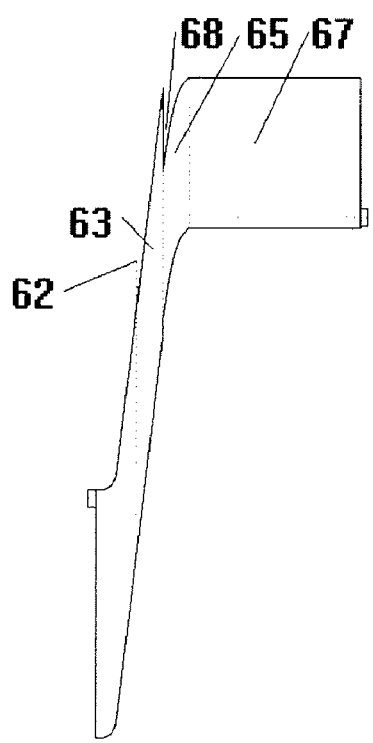
Figure 4A        Figure 4B
Figure 4

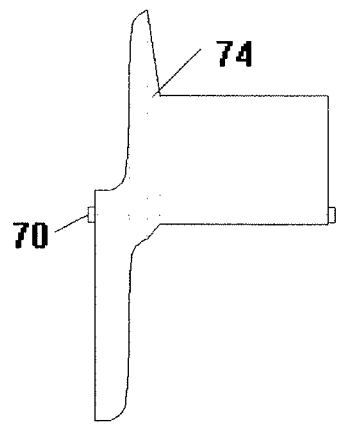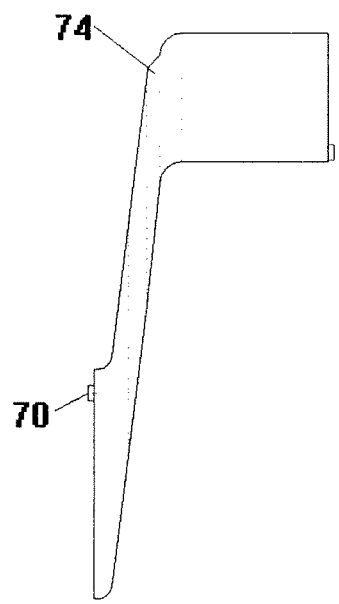
Figure 5A    Figure 5B
Figure 5
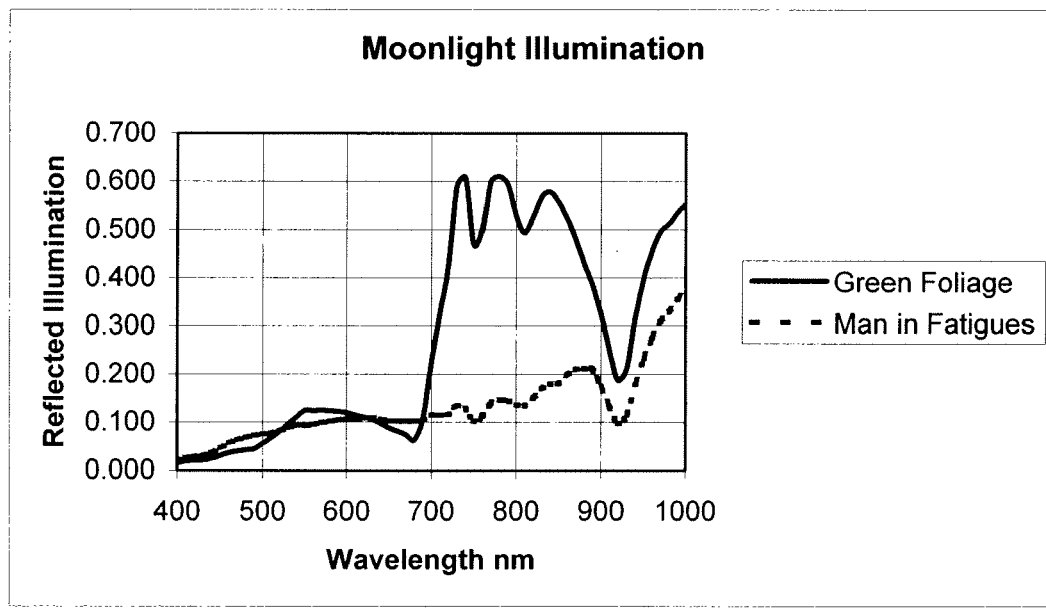
Figure 6

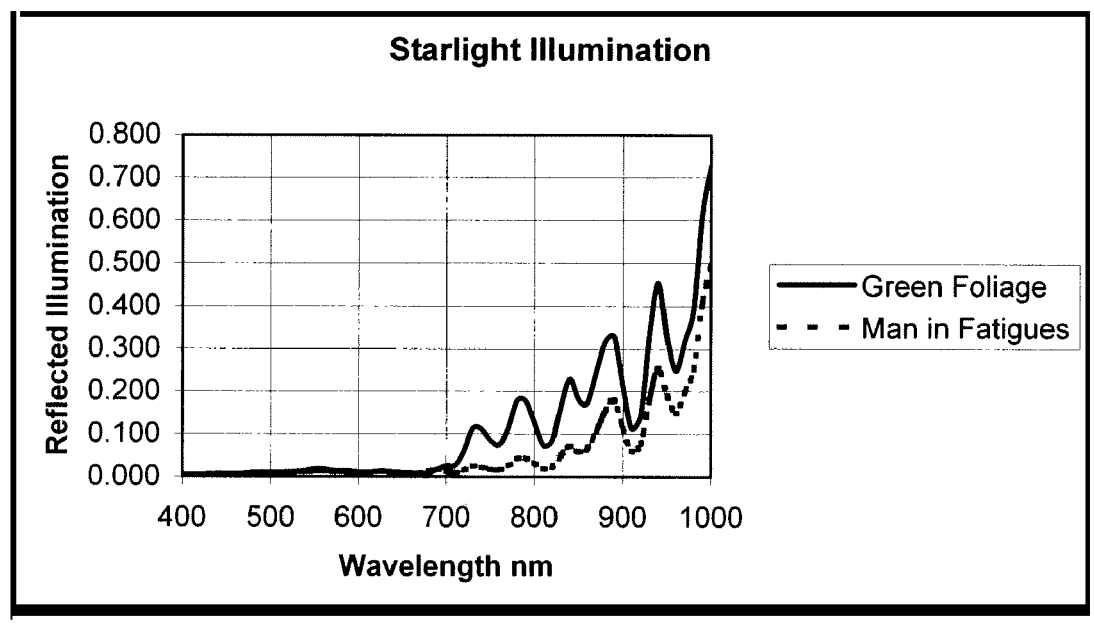
Figure 7
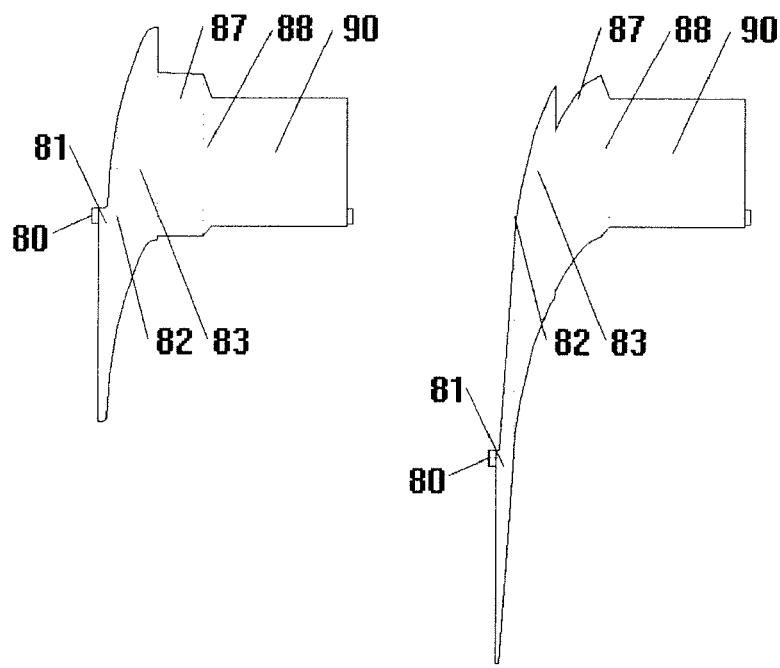
Figure 8A      Figure 8B
Figure 8

Figure 8
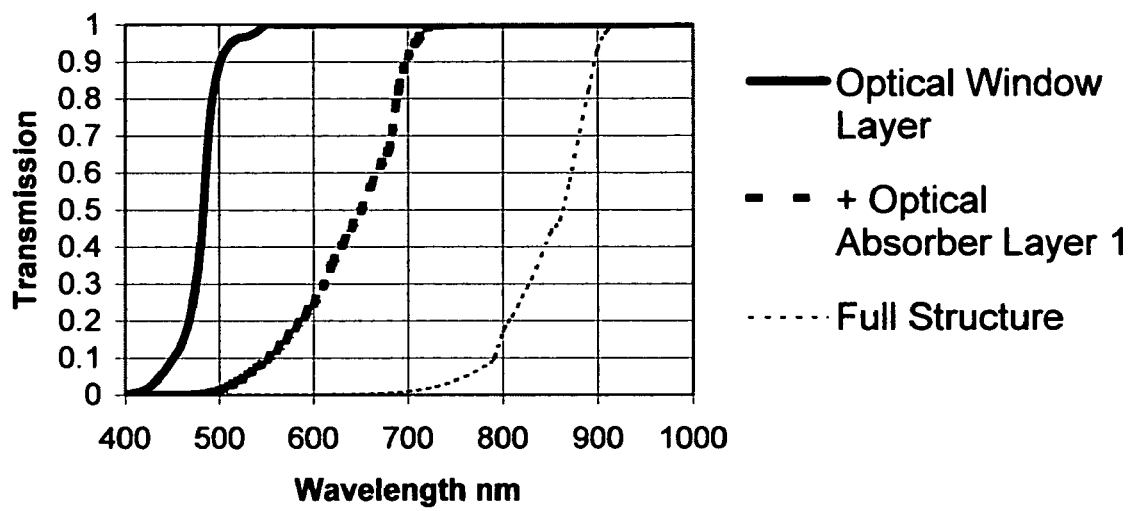
Figure 9
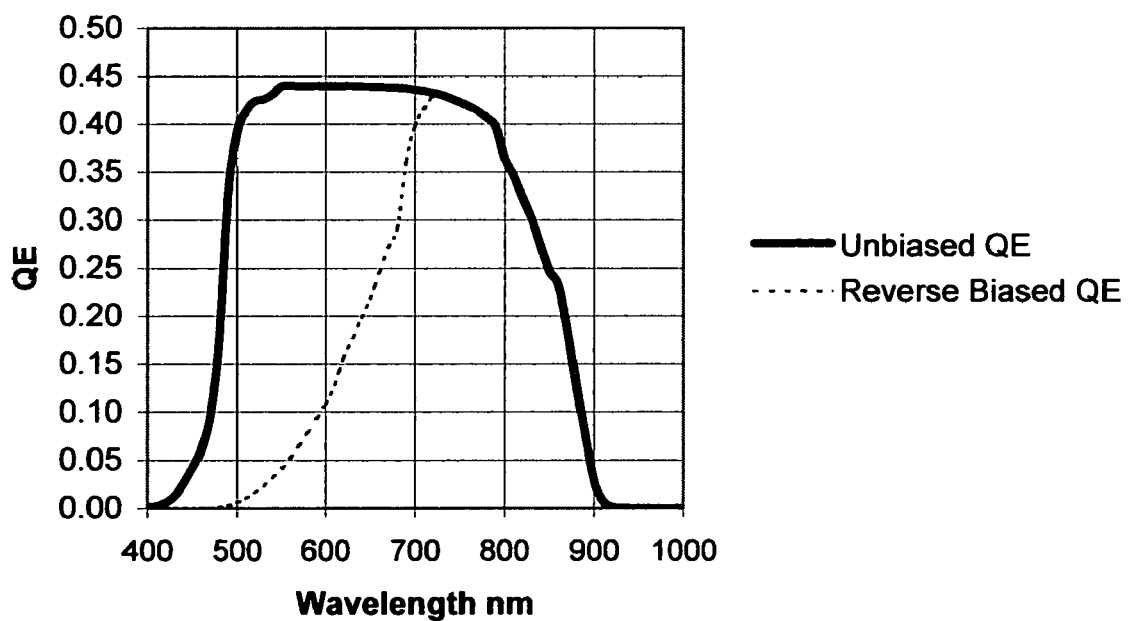
Figure 10

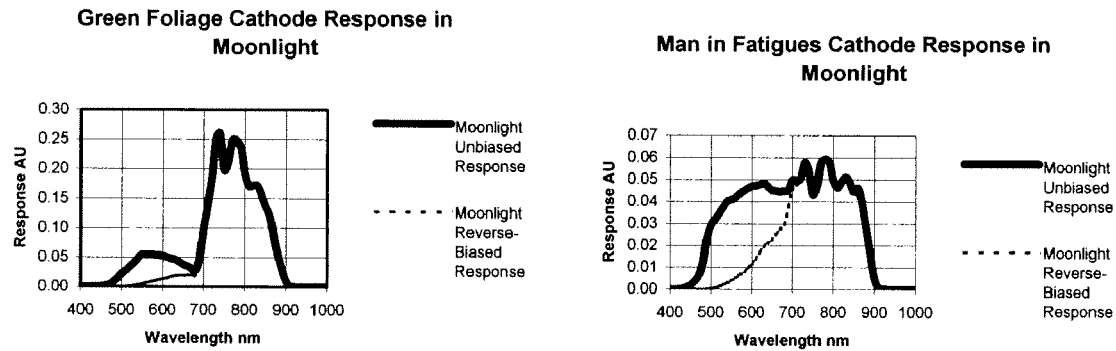
Figure 11
Figure 12
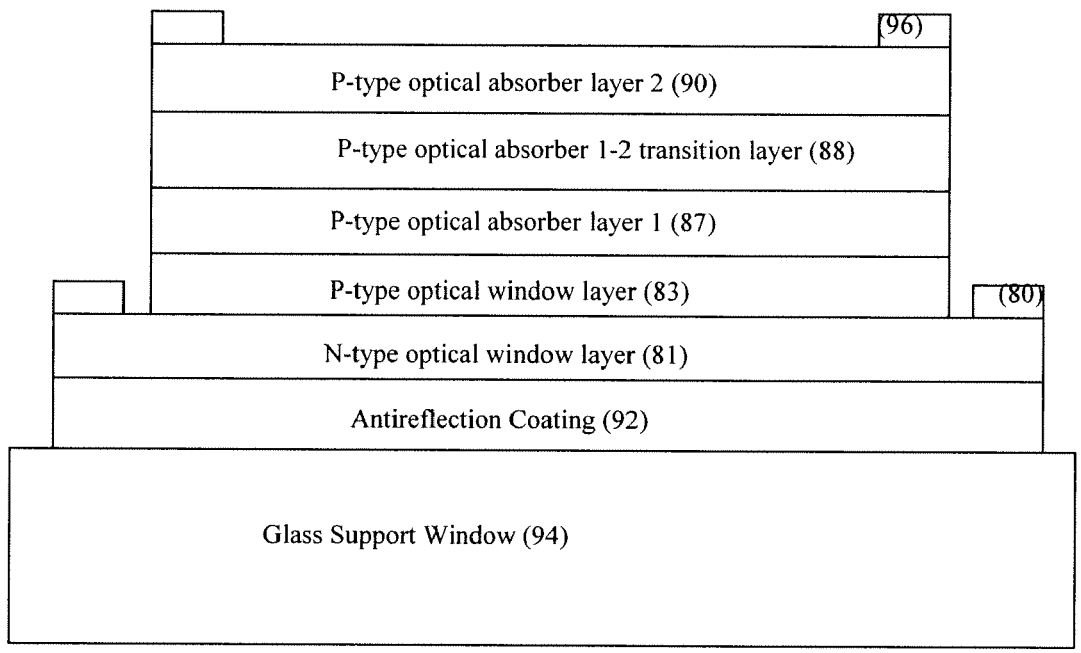
Figure 13

PHOTOCATHODE STRUCTURE AND OPERATION

FIELD OF INVENTION

This invention describes a new photocathode or photocathode structure with the capability of electrically altering its spectral response as well as novel systems for its use. The photocathode may be used in a variety of systems to sense the presence of light or to recreate in electronic form incoming light images. This novel structure is suitable for various applications such as medical, instrumentation, night vision, image intensifiers, cameras and camera like systems and for use as Photo-Multiplier-Tubes (PMTs) and in applications for such tubes.

BACKGROUND

PMT's, Image intensifiers and Electron Bombarded Active Pixel Sensors (EBAPS) are used in various ways. Many such systems are further distinguished by the spectral or spatial information contained in the incoming and output light images. This invention can provide both spectral and spatial information without the need for moving parts. Spatial information is derived by sensing the position at which the photo-electrons exit the photocathode structure. Spectral information is derived by comparing the intensity of detected light between at least two sequential measurements where the cathode of this invention is toggled between spectral states. One example where this invention is useful involves the use of a PMT that is looking for multiple florescent signatures in a flow cytometry system. The lack of moving parts in this invention facilitates very rapid spectral shifts in spectral response to be achieved. This permits system manufacturers to measure the "color" for example of a single cell as it passes through the analysis window of a flow cytometer without the need for multiple PMTs or a complicated optical path.

Another interesting application involves low light imaging systems. Night vision equipment is widely used in military and security applications. A number of sensor technologies are currently used to achieve low light level imagery. This invention is particularly useful for image intensifier based night vision camera systems. In these systems, a photocathode detects incoming light. The photocathode performs a photon to free electron conversion. Intensifiers also contain a gain mechanism by which the energy or number of free electrons are multiplied. Finally, intensified camera systems contain means by which the multiplied signal from the gain stage may be converted into a viewable image such as through video signals. Prior art intensifiers have incorporated a microchannel-plate (MCP) as an electron multiplier and use a phosphor screen which may be viewed directly or may be coupled to a CCD or CMOS image sensor to generate an ultimate video picture.

The great majority of commercially available night vision systems generate a monochrome image. There are a number of distinct approaches that have been proposed to generate color night vision sensors and cameras. There are calculated approaches (New Scientist Magazine, Issue 2486, 12 Feb. 2005, page 21) that map the monochrome image of a standard image intensifier onto a color pallet for display and, there are approaches that generate information based upon altered lighting or sensor spectral response. This invention is related to the latter class of systems.

There is described a novel photocathode structure in which a rectifying junction is located on the surface of or contained in the first layer of a transmission mode semiconductor photocathode structure. In the event that the photocathode is positioned on a support, light directed at the photocathode layer will first pass through the support layer such as glass and then through a rectifying junction before striking the balance of the photocathode structure. If such a support is not required then the incoming light will strike the photocathode structure directly passing through a rectifying junction before entering into the rest of the photocathode structure. Also described is a novel system in which a change in spectral response can be achieved by reverse biasing the rectifying junction. By comparing the output of the system with and without bias, one is able to create a multi color image. Thus, the novel photocathode makes possible for example high performance color night vision intensifier systems and cameras. Although the spectral distribution of a sensor can also be shifted using an electrically alterable optical filter placed in front of a standard PMT or image intensifier, such filters, as a means toward multi color imaging, cause undesirable signal loss. Notwithstanding, if one remains interested then one of the most suitable filters of this type designed to date is described in NASA tech brief NPO-20245.

In describing the quality or usefulness of a night vision sensor one usually refers to an application specific figure of merit. For example, an ideal head mounted color night vision sensor for use in military environments will have a low weight, detect 100% of the incident photons within it's passband with Shot noise limited signal to noise ratio (SNR) while simultaneously drawing virtually no power. Simultaneously, system weight would be minimal.

All existing and proposed color night vision cameras make some compromises vis-à-vis the ideal sensor. The color night vision system proposed by Smith in U.S. Pat. No. 6,570,147 employs multiple image intensifiers positioned behind a prism that splits different colors of light to each sensor. This approach is very efficient in preserving all of the photons incident upon the objective lens and routing them to a suitable sensor. However, this system suffers from size, weight and power problems. The fact that each color channel requires a separate intensifier/video capture channel with its associated size and power penalty, effectively eliminates this as a viable approach for a head mounted sensor. Splitting prism systems also typically require objective lenses that have a large back focal length. This represents a serious limitation for head mounted night vision systems where wide field of view and low F/# lenses are required. These systems have the further disadvantage of being expensive because of their many components.

A number of color night vision cameras that employ a movable filter to sequentially change the spectral response of the night vision sensor have been proposed. These are exemplified in U.S. Pat. Nos. 6,614,606 and 4,724,354. The temporally and spectrally distinct frames are then recombined either in the optical or electrical domain in order to create a color output image. Filter approaches are generally somewhat less efficient with incident photons than those which employ a splitting prism in that spectral changes are affected by absorbing photons before they reach the photocathode. The major draw back of this class of systems is the reliability and size of the moving filters. Reliability and size make these systems unsuitable for use for example in military head-mounted goggles.

A second class of filter-based color night vision goggles generate a color image by filtering small physically adjacent patches of the photocathode in order to generate a mosaic of spectrally and spatially distinct patches at the output of the sensor. These patches, also referred to as tiles, can then be optically or electrically recombined into a color image. An example of this approach is described in U.S. Pat. No. 5,742, 115. On first inspection, this appears to be a lightweight, compact and potentially low power approach to achieving a head-mounted color night vision system. Unfortunately, the spectrally tiled photocathode approach suffers from the imperfect modulation transfer function (MTF) found in image intensifiers. Furthermore, these systems suffer from very low manufacturing tolerance budgets; this can result in a prohibitively expensive sensor.

Photocathodes come in a wide variety of types and subclasses. Many of the early night image intensifiers employed Multialkali Antimonide Photocathodes as described by Sommer in Photoemissive Materials, A. H. Sommer, Robert E. Krieger Publishing Company, Huntington, N.Y., 1980. Modern versions of these cathodes account for a significant fraction of the image intensifiers sold and in use today. In the 1950s, research on a new class of photocathodes was anchored and accelerated when William E. Spicer reported in Phys. Rev. 112, 114 (1958) concerning a detailed model as to give understanding and permit engineering of negative electron affinity semiconductor photocathodes. The instant disclosure makes use of negative electron affinity (NEA) and Transferred Electron (TE) semiconductor photocathode structures. After Spicer's publication, numerous varieties of photocathodes were developed. U.S. Pat. No. 3,631,303 details one of the early designs that employs a band-gap graded semiconductor optical absorber layer. In the described structure, the semiconductor substrate is a large band-gap material that acts as a passivation layer for the back surface of the active layer. Though described as a reflection mode photocathode, using a thin substrate window layer, the structure works equally well in a transmission mode. A modern third generation image intensifier photocathode as disclosed in U.S. Pat. No. 5,268,570 makes use of a P-type GaAs or InGaAs optical absorber layer coupled with a P-type AlGaAs window layer. High P-type doping levels typically $>1\times10^{18}/cm^3$ and the larger band-gap of the AlGaAs or AlInGaAs window layer result in a hetero-structure that is very efficient at preserving photo-generated electrons. An example and method of manufacture of a modern GaAs photocathode is described in U.S. Pat. No. 5,597,112. Photoelectrons that diffuse to the hetero-junction experience a potential barrier and are reflected back into the absorber layer and hence, toward the vacuum emission surface. The ramped band-gap structure described in U.S. Pat. No. 3,631,303 plays a similar role in directing the diffusion/drift of photoelectrons toward the vacuum emission surface.

These semiconductor NEA photocathodes can be classed as passive photocathodes. In use, these cathodes are set to a single fixed electrical potential. In other words, there are no electric fields within the cathode that are specified through the application of a bias voltage across two or more contact terminals. It turns out that all commercially successful, semiconductor, NEA cathodes that are used for night vision applications fall into this class. In part this results from the fact that it is very difficult to eliminate electric field induced dark current sources in active photocathode structures. Current GaAs based night vision cathodes typically show room temperature emitted dark currents on the order of $1\times10^{-14}$ A/cm$^2$ while simultaneously demonstrating external quantum efficiencies in excess of 40%; this is a very demanding requirement for biased photocathode structures.

A number of active photocathode structures are known. Some cathode structures such as those described in U.S. Pat. Nos. 3,361,303, 5,047,821 and 5,576,559 have met with commercial success in gated applications. Others, such as that described in U.S. Pat. No. 3,814,993, are not known to have had a significant commercial impact. Active, electrically gated/shuttered intensifier systems are typically used in conjunction with active illumination and are therefore more tolerant of high photocathode dark current. In fact, commercially available active cathodes often show room temperature emitted dark currents on the order of $5\times10^{-8}$ A/cm$^2$. Dark currents of this order eliminate intensifiers from contention as room temperature passive night vision sensors. The power requirements associated with cooling eliminate the chilled variant of these cathodes as a candidate for small light weight units such as head mounted night vision systems. However, where weight is not a consideration, these photocathodes may be used in such equipment.

In its most basic form, this invention is a hetero-junction semiconductor photocathode containing a larger band gap window layer as part of a rectifying junction, and an optical absorber-emitter layer. The window layer contains a p-type section directly overlying the optical absorber layer. The side of the p-type layer opposite the optical absorber layer is over-laid by either a Schottky barrier layer (possibly with an interposed lightly doped or intrinsic semiconductor layer) or an n-type semiconductor layer. The thickness and doping in the P-type segment of the window layer is designed such that when no bias is applied across the rectifying junction, at least on the order of 100 Angstroms of the P-type window layer remains undepleted. Electrical contacts are separately made to both the N or Schottky layer of the rectifying junction and P-type section of the cathode. Consequently, when no bias voltage is applied, the window layer of the instant invention functions in the same manner as the window layer described in U.S. Pat. No. 5,268,570. However, when a reverse bias of a few volts is applied, the depletion layer associated with the rectifying junction will extend into the optical absorber layer. The electric field associated with the depletion layer will prevent photoelectrons generated in said layer from diffusing to the vacuum surface. The applied bias voltage should be sufficient to pull the conduction band of the window layer below that of the undepleteted absorber layer. Similarly, any dark current electrons generated as a result of the applied field will be captured. These electrons may be temporarily captured in the well formed at the depleted hetero-junction. Eventually, these electrons will be thermally emitted over the hetero-junction barrier. Electrons that drift into the contact layer will be conducted away.

BRIEF DESCRIPTION OF THE DRAWINGS

FIG. 3, including FIGS. 3A and 3B are sketches of band gap diagrams of an embodiment of the invention.

FIG. 4, again through FIGS. 4A and 4B, are band gap sketches of an incrementally improved embodiment compared to those illustrated in FIG. 3.

FIG. 5, again through FIGS. 5A and 5B, are band gap sketches of another embodiment which includes a transition region between the window layer and the optical absorber layer.

FIG. 6 is a graph of spectral reflections vs. wavelengths for two different objects under moonlight conditions.

FIG. 7 is another graph of spectral reflections under starlight conditions.

FIG. 8, shown in FIGS. 8A and 8B, are bandgap sketches of the preferred photocathode.

FIG. 9 is a graph of transmission curves of the structure described in Table 1.

FIG. 10 illustrates the photocathode spectral response in two states.

FIG. 11 shows the modeled spectral response of the photocathode when illuminated by reflected light of green foliage in moonlight.

FIG. 12 illustrates the modeled spectral response of the photocathode when illuminated by reflected light from a man in fatigues in moonlight conditions.

FIG. 13 is a schematic cross section of the photocathode structure of Table 1.

DETAILED DESCRIPTION OF THE INVENTION

Figure 1:
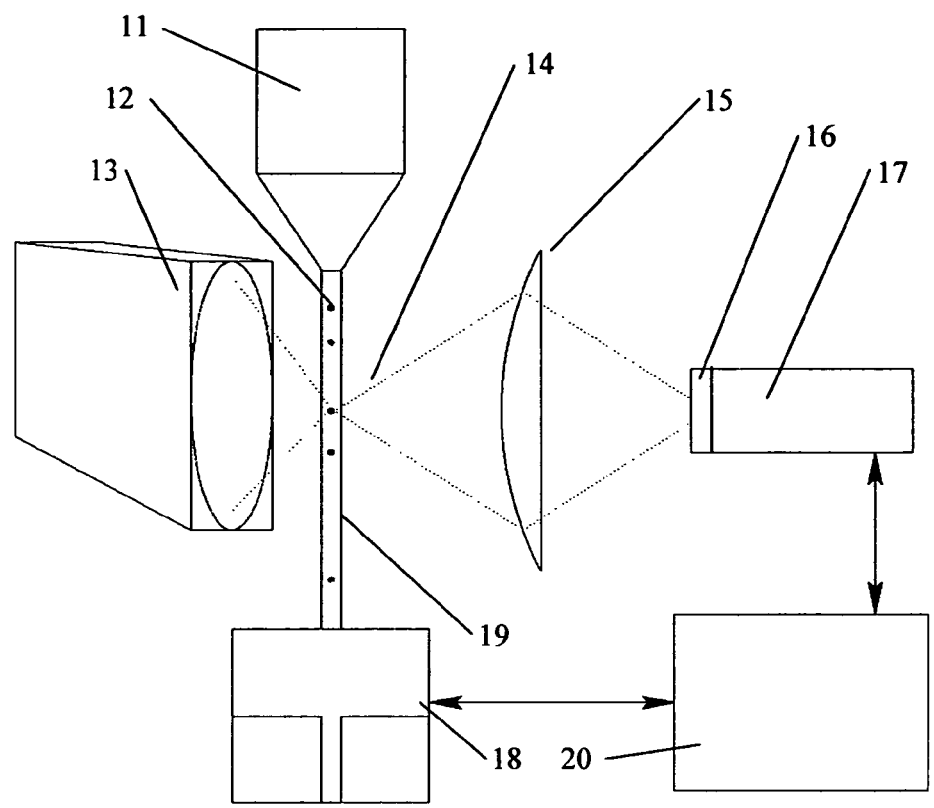
FIG. 1 is a schematic of a flow cytometry system.

Referring now to FIG. 1, there is illustrated a flow cytometry system that may be used to separate and/or count a specific type of blood cells, employing a two-color photocathode 16 in photomultiplier tube 17. Tube 17 enables distinguishing by color the type of cell 12 being subjected to examination while passing through sample tube 19. A supply of blood or other suspension is positioned in supply and flow control mechanism 11 which releases this suspension and regulates its flow through tube 19 where it is examined during transfer. Light source 13 illuminates a small portion of sample tube 19. This is illustrated by dotted lines 14 which show the path of light from light source 13 through tube 19 through collecting optics 15 and into photocathode 16. A computer control unit 20 both controls the photocathode 16 and analyzes the signal from the photomultiplier tube 17. It also controls cell separation device 18.

The use of the two color photomultiplier tube 17 allows the cytometry unit to improve the signal to noise ratio between the signals generated by different cells by keying on the color of the emitted or scattered light. This color can also be generated in a system using color separation elements and multiple photomultiplier tubes. However, the use of a single photomultiplier tube 17 simplifies the optical design, reduces components in the system and lowers overall system costs.

Figure 2:
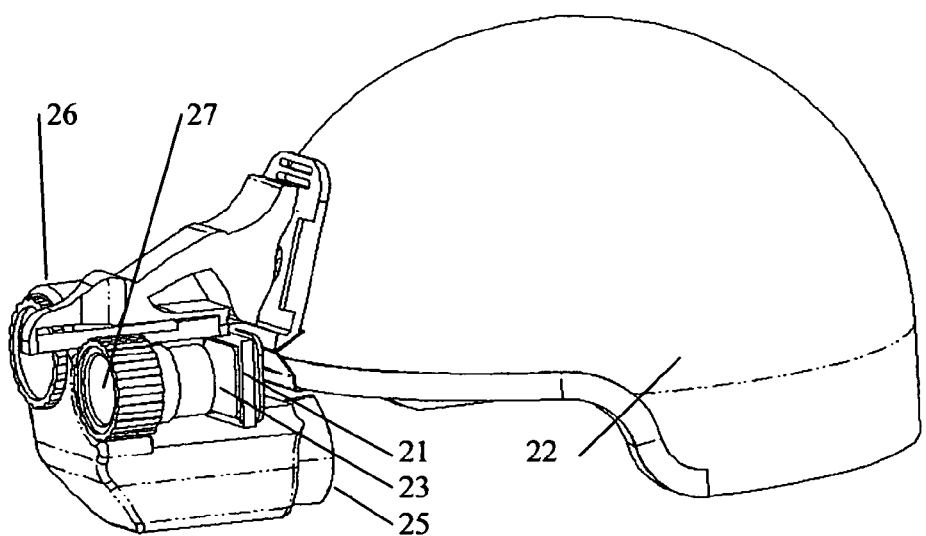
FIG. 2 is a schematic of an exemplarily night vision headgear.

Referring now to FIG. 2, there is illustrated a military type helmet 22 used in conjunction with a night vision system including a mounted imaging system. The imaging system is shown with a section of its case removed in order to show the position of enclosed elements. Thus in this Figure color photocathode 23 and the sensor 21 can be seen. The sensor can be an EBAPS sensor 21, which is preferred in this invention. Processing electronics and the display unit are included in the section of the case labeled 25. A user will gaze at the display 25 while wearing helmet 22.

The particular night vision system illustrated in this Figure melds both thermal and optical imaging. Thus lens system 26 illustrates a lens arrangement dedicated to thermal imaging and lens system 27 illustrates the lens system dedicated to the night vision channel. The processing electronics of this unit will fuse the thermal and night vision images in the process of generating a full three-color "false color" image. This image will contain considerably more information than modern monochrome systems. The thermal image is good for spotting hot targets like people or recently used vehicles. Also the thermal image provides a base level of performance in smoky and no-light environment. The color night vision image provides improved resolution and situational awareness. The color night vision image will also provide improved ability to see camouflaged objects. It should be understood that night vision systems can and are made without a thermal system incorporated and in such a case thermal optics 26 would be omitted as well as processing electronics to merge the thermal and night vision images.

FIG. 3 shows a sketch of the band-gap diagram of an embodiment of the invention that employs a semi-transparent rectifying surface contact (51) on the window layer (53). Potential materials for this contact include but are not limited to, Indium Tin Oxide, Zinc Oxide or a thin metal layer such as Platinum, Palladium, Tungsten or Nickel. An ohmic contact (59) is made to the P-type semiconductor photocathode (57). The P-type contact can be made to a small portion of the cathode preferably at the edge of the device. FIG. 3A shows the structure without an applied bias voltage. FIG. 3B shows the device under reverse bias.

FIG. 4 shows a sketch of the band-gap diagram of an incrementally improved embodiment. As in FIG. 3, at zero applied bias voltage, FIG. 4A, the window layer (63) provides a potential barrier to photoelectrons generated in the optical absorber layer (67). Similarly, FIG. 4B shows that when a reverse bias is applied, the depletion layer (65) from the rectifying junction (62) now extends into the optical absorber layer. However, in this embodiment, the rectifying junction now is made from a N-P homo-junction within the window layer. This approach eliminates potential light loss from "semi-transparent" surface contact of the previous embodiment. In this case the window contact is an ohmic contact (60) to the N-type semiconductor surface layer (61). The thickness of the N-type surface layer is chosen so as to avoid full depletion even at full reverse bias voltage. In this way, the contact can be placed at the edge of the cathode where it will not interfere with the signal path. Suitable material pairs for the window layer and optical absorber layer respectively include but are not limited to: $Al_xGa_{1-x}As$—$GaAs$, $Al_xGa_yIn_{1-x-y}As$—$Ga_{x+y}In_{1-x-y}As$, $InP$—$In_xGa_{1-x}As_yP_{1-y}$, $AlGaAs_xP_{1-x}$—$GaAs_xP_{1-x}$, and $AlGaN$—$GaN$, for example.

In high-quality direct band-gap materials such as GaAs, carriers trapped in the well formed between the window layer and the depleted optical absorber layer may collect. Similarly, the band lineup between the p type window layer and the first optical absorber layer may generate a well (68) at the interface that will trap optically generated carriers. If either of these issues proves to be a significant problem, the structure may be further modified as shown in FIG. 5. In this new structure a ramped transition region (74) has been added between the window layer and the optical absorber layer. The doping and thickness of this layer is chosen such that with no bias there is no well >~3 kT in depth, also upon application of a reverse bias, there is no longer a barrier to electron flow in the conduction band. Consequently, under reverse bias electrons generated or trapped in the depletion region of the optical absorber layer are swept into the N-type window layer where they are conducted away through the window layer ohmic contact (70). FIG. 5A shows a sketch of the band-gap diagram of the unbiased structure including the transition layer. FIG. 5B shows the structure under reverse bias.

As light travels through the photocathode, some of it is absorbed. The absorption coefficient describes the rate at which light is absorbed as it travels through the cathode. The position at which the light is absorbed is highly dependant on the wavelength of the light. Light that has energy greater than that of the band gap of the window layer has a high probability of being absorbed within the window layer. Light that falls between the band gap of the window layer and the band gap of the absorber layer will primarily be absorbed in the optical absorber layer. Within the stated wavelength window, on average, the shorter wavelength light will be absorbed closer to the window-optical absorber layer interface while light of longer wavelengths will be absorbed closer to the vacuum emission surface. When the N-P junction of the invention is reverse biased, electrons generated in the depletion region will be swept away so as not to contribute to the emitted signal. Similarly, photoelectrons generated close to the edge of the depletion region will have a higher probability of drifting into and being captured by the depletion region than electrons generated near the vacuum emission surface. The net result of these effects is that the short wavelength response of the photocathode will be reduced more than the long wavelength response when the N-P junction is placed in reverse bias. This change in spectral response can be used to distinguish color information present in the incoming signal. It should be noted that the change in spectral response is achieved without the use of any moving parts or external filters. In essence, the depleted optical absorber layer and material immediately adjacent to it, plays the role of a removable filter. Furthermore, it should be noted that the N-P junction is being placed in reverse bias to accomplish this change. In a reverse biased condition, the N-P junction is rectifying. Consequently, virtually no power is required to maintain this condition and only minimal power is required to achieve that state. The anticipated power draw is well suited for use in battery-powered systems such as head mounted image intensifier systems.

An improved version of this cathode incorporates an optical absorber layer that is distinguished by at least two different material compositions. The split between the regions is characterized by an increase in the energy of the unbiased conduction band edge, where the conduction band edge increases in energy as one scans from the vacuum emission surface to the window layer. This change can be achieved via a continuous ramp as depicted in U.S. Pat. No. 3,631,303 or it can take the form of a discontinuous step. The window layer still contains the previously described N-P junction. One goal of this change in the unbiased conduction band potential is to provide effective back surface passivation even when the N-P junction is held in its reverse biased state. Electrons generated in a portion of the optical absorber layer that is more than ~3 kT in energy below the conduction band energy at the edge of the N-P junction depletion region would be unlikely to diffuse into the depleted junction. This approach will also increase manufacturing tolerances and improved spectral repeatability in the photocathode. Through the use of doping, material composition, layer thickness, and applied reverse bias voltage, the spectral response of both the biased and unbiased states of the photocathode can be widely tuned. It should be noted that with the structure described, multiple distinct spectral responses can be obtained by changing the applied N-P bias voltage and hence the thickness of the depletion layer.

An improved device achieved through this invention is an image intensifier suitable for head mounted night vision equipment. Consequently, this disclosure will focus on detailing the structure of a cathode suitable for military night vision use. For the sake of simplicity, a two-color system will be considered. The first design choice revolves around the choice of spectrum for the two photocathode states. This in turn is driven by the spectrum of light available for detection and the information that can be obtained by comparing the relative intensity of the two spectrums. All spectral illumination and reflection information in this disclosure was extracted from the Night Vision and Electronic Sensors Directorate IICCD night vision camera performance-modeling program distributed by Ontar Corporation. In order to look at a figure of merit that may for example be applicable to a military requirement, targets of green foliage and a man in fatigues is compared. However, it should be readily appreciated that such objects may be of interest in strictly civilian applications too; for example, when driving, biking or walking at night being able to distinguish between dirt, road surfaces and foliage is of value. Also of course police uses for this invention should be apparent. In an attempt to maintain manufacturing maturity a GaAs long wavelength cut-off is assumed.

FIG. 6 shows the spectral reflection vs. wavelength for green foliage and a man in fatigues under moonlight illumination. Assuming a GaAs long wavelength cut-off, the spectral area of interest ranges from ~400 nm to ~900 nm. The most pronounced spectral feature in this band is the dramatic increase in reflectivity in green foliage in the 680-~720 nm range. Consequently, for a two color system, the logical place to separate the two spectral bands is ~700 nm. When moonlight is present, current night vision systems operate at high signal to noise ratios. Consequently, there should be sufficient information present in the image to generate a good color signal. Similarly, when light is plentiful, the loss of light associated with the light absorbed in the depletion region will have minimal negative effect on image quality. On the other hand, under no-moon conditions such as clear starlight, the low level of available light limits modern image intensifiers. In this case, the loss of photons should be minimized.

FIG. 7 shows the spectral reflection from both green foliage and a man in fatigues under starlight conditions. This Figure shows that under starlight conditions there is virtually no light present at wavelengths shorter than 700 nm. Consequently, under the darkest conditions the proposed absorption cut-off of the depletion region will not result in any loss of signal. In essence, as with the human eye, the color signal of the described photocathode will fade at the lowest light levels without degrading the signal to noise ratio of the monochrome image. One can, for example, envision that a luminance based image would be displayed as each field of data is captured. Color information could be calculated and applied after a delay of one field. Alternately, one could display all fields in real time perhaps for example displaying unbiased frames with a combination of green and red illumination while displaying reverse-biased fields with only green light. The exact algorithm used will represent a trade off between image quality and the resources, such as memory and power, required to achieve a given level of performance. The subject is discussed in more detail in connection with the discussion of FIGS. 11 and 12 below.

PREFERRED EMBODIMENT

Table 1 describes a preferred semiconductor layer structure for a two-color photocathode designed for night vision applications. The layers are listed in the order they are encountered by incoming light in a transmission mode structure. The preferred method of manufacture of the structure is via organo-metalic-vapor-phase-epitaxy (OMVPE).

TABLE 1

| Layer Number | Composition | Doping #/cm$^3$ | Thickness Microns | Layer Title/Function |
|---|---|---|---|---|
| 1 (81) | Al$_{0.8}$Ga$_{0.2}$As | N-type, $1 \times 10^{18}$ | 0.2 | N-type optical window layer |
| 2 (83) | Al$_{0.8}$Ga$_{0.2}$As | P-type, $1 \times 10^{16}$ | 0.25 | P-type optical window layer |
| 3 (84) | Al$_{0.8}$Ga$_{0.2}$As Linear Ramp | P-type, $2 \times 10^{16}$ | .2 | P-type optical window to P- |

TABLE 1-continued

| Layer Number | Composition | Doping #/cm$^3$ | Thickness Microns | Layer Title/ Function |
|---|---|---|---|---|
| | to Al$_{0.32}$Ga$_{0.68}$As | | | type optical absorber transition layer |
| 4 (87) | Al$_{0.32}$Ga$_{0.68}$As Linear Ramp to Al$_{0.28}$Ga$_{0.72}$As | P-type, 1 × 10$^{16}$ | 0.5 | P-type optical absorber layer 1 |
| 5 (88) | Al$_{0.28}$Ga$_{0.72}$As Ramp to GaAs | P-type, 1 × 10$^{16}$ Ramp to P-type, 7 × 10$^{18}$ | 0.1 | P-type optical absorber 1-2 transition layer |
| 6 (90) | GaAs | P-type, 7 × 10$^{18}$ | 1.5 | P-type optical absorber layer 2 |

It is noted that all commercially successful semiconductor photocathodes employ a thin "activation" layer to lower the work function of the vacuum surface of the photocathode. In the case of GaAs photocathodes the layer is typically composed of cesium and an electronegative element such as oxygen or fluorine. The activation process is well known to those skilled in the art of making NEA photocathodes and is used with the photocathodes described herein. GaAs photocathode activation physics is described in detail by: Applied Physics A: Materials Science & Processing (Historical Archive) Negative affinity 3-5 photocathodes: Their physics and technology by W. E. Spicer, [1]Issue: Volume 12, Number 2, Date: February 1977 Pages: 115-130.

The preferred embodiment builds upon the structure described in FIG. 5. The doping and thickness in the layer is chosen in the N-type optical window layer (81) such that the layer is not fully depleted even when the full reverse bias voltage is applied. As previously described, the doping and thickness of the P-type optical window layer (83) is chosen such that the unbiased junction (82) does not fully deplete this layer; sufficient undepleted material to achieve an effective conduction band barrier to prevent electron flow from P-type optical absorber layer 1 (87) to the depleted region of P-type optical window layer must remain. The ramped transition layer of FIG. 5 was employed primarily to minimize the depth of the electron trap formed at the window layer to optical absorber layer interface. The trap is formed as a result of the band line-up between the high aluminum content AlGaAs window layer and the low aluminum content AlGaAs optical absorber layer. Qualitatively, there are a number of differences between FIG. 5 and this preferred embodiment. The optical absorber layer has been split into two layers. The first layer (87) has an average composition of Al0.3Ga0.7As at a P-type doping level of ~1×1016. This band gap was chosen in order to achieve significant absorption at wavelengths below 700 nm. The doping was chosen to allow the depletion layer to extend through this layer at relatively low voltages, ~5 to 10 Volts of applied bias. The compositional ramp in this layer will enhance the drift rate of photo-generated electrons thereby increasing collection efficiency. A P-type optical absorber 1-2 transition layer (88) was also added. In this layer both the composition and doping are ramped to achieve an endpoint of ~P-type, 7×1018 doping levels in GaAs. There is wide latitude in terms of acceptable ramp profiles. However, a logarithmic doping ramp coupled with a linear composition ramp would work well. The structure simply needs to ensure that there are no barriers to electron flow to electrons leaving P-type optical absorber layer 1 drifting into P-type optical absorber layer 2. The high average doping in this layer will provide a hard stop to the depletion of the reverse biased N-P junction thereby providing a degree of spectral response repeatability and manufacturing tolerance. The fact that the depletion region will reliably stop within this transition region also insures that this layer will also serve as a conduction band barrier to prevent the loss of P-type optical absorber layer 2 (90) photoelectrons into the depletion region when the cathode is in a state of reverse bias.

FIG. 8A shows a sketch of the band-gap diagram of a preferred embodiment structure in its unbiased state. FIG. 8B shows the structure under biased conditions. As light enters the preferred embodiment shown in FIG. 8 some of the light is absorbed and some is transmitted. The structure can be thought of as a series of stacked, long-wavelength-pass, optical filters. The spectral absorption of each filter is a primary function of layer thickness and composition and to a lesser extent the layers doping. The light actually absorbed in a given layer generates the electron-hole pairs (EHPs) that can in turn be recombined or emitted into vacuum as photoemission. The structure is conceived as a transmission mode structure. Light enters through the optical window layer (81, 83). Unabsorbed light and photoelectrons eventually exit from P-type optical absorber layer 2 (90).

FIG. 9 shows the spectral transmission of the layer structure described in Table 1. Ignoring reflection losses, the first line shows the modeled transmission of the combine N-type optical window layer and P-type optical window layer. The second trace also includes the optical absorption of P-type optical absorber layer 1. The final trace includes the optical absorption of the full structure.

The difference between the "Full Structure" trace and the "Optical Window Layer" trace represents the light available to the photocathode for absorption and subsequent photoemission in its unbiased state. The difference between the "Full Structure" trace and the "+ Optical Absorber Layer 1" trace represents the light available to the photocathode for absorption and subsequent photoemission in its reverse biased state. Diffusion length and escape probability losses must be considered to determine exact photocathode spectral response curves, but the basic shape of the curves for the specified structure grown with state of the art equipment will be specified by the optical properties of the layers shown in Table 1.

FIG. 10 illustrates the photocathode spectral response in both its unbiased and reverse biased states. In this structure, escape probability was set to match the quantum efficiency (QE) of state of the art night vision photocathodes, diffusion length losses were not considered.

FIG. 11 and FIG. 12 show the spectral response of the cathode structure described in Table 1 in moonlight illumination of green foliage and a man in fatigues respectively. Due to the differences in spectral scene reflectivity, the ratio of biased to unbiased cathode response is different for the two different targets. In fact, the ratio of reverse biased to unbiased photocathode response for green foliage is 0.84 for green foliage whereas the ratio is 0.65 for a man in fatigues. This difference in ratio is that raw data that a camera system will use to assign a color to the individual pixels or patches of pixels that detect the various targets.

Clearly, a large variation in cathode spectral response can be obtained via tuning the thickness and composition of various layers. In general, for example, if the thickness of the P-type optical absorber layer 1 is increased, the transition sharpness of the long-wavelength-pass filter associated with that layer is also increased. This would in turn result in a less pronounced short wavelength response "tail" in the QE of the reverse biased photocathode thereby improving color fidelity. In choosing a suitable structure many considerations come into play, which include but are not limited to: the minority carrier diffusion length in the material chosen for P-type optical absorber layer 1, the voltage required to deplete P-type optical absorber layer 1, the junction leakage when reverse bias is applied, cathode cost, and the like.

In this description, the focus has been on a specific application, head mounted night vision systems. In these systems, 25 to 120 Hz frame rates are anticipated. Consequently, switching times between the unbiased and the reverse biased photocathode spectral response curves can take tens or hundreds of microseconds without significantly impacting system performance; these switching times are not particularly demanding for the disclosed structure. Switching time is fundamentally limited by the R-C time constant of the structure. The capacitance of the structure is specified by the depletion thickness of the junction and the dielectric constant of the material/materials in the depletion region. The thickness of the depletion region is primarily a function of the doping levels chosen for the material in the depletion region. The resistance on the other hand, is a function of: the doping levels in the undepleted layers on both sides of the junction, the mobility of carriers in the undepleted layers and the resistance of the contacts to each of these layers. Lowering the resistance of the undepleted layers and lowering the capacitance of the junction will result in shortened switching times. Clearly, optimization of these structures is highly application dependant. The fact that the layers share both optical and electrical roles in the cathode function suggests that engineering trade-offs will be required for most applications.

Beyond the electrical issues discussed previously, there are numerous practical issues that must be considered to generate a practical photocathode. Perhaps the most obvious of these issues are photocathode physical support and anti-reflection coating. In the case of the AlGaAs—GaAs photocathode structure described in Table 1, one can make use of the technology developed for third generation image intensifiers. A $SiN_xO_y$ layer with an appropriate index of refraction and thickness can be used as an antireflection coating. Corning Code 7056 or a glass of similar expansion can be used via glass bonding as a support structure.

FIG. 13 shows a schematic cross section of the photocathode structure of Table 1 with an antireflection coating (92) and a supporting window layer (94). Contact detail is also shown. The small squares at the edges of the N-type optical window layer are preferably N-type ohmic contacts (80) known to those skilled in the art. Similarly, the small squares overlying the P-type optical absorber layer 2 are preferably P-type ohmic contacts (96) known to those skilled in the art. The mesa structure may be generated by photo-lithographically defining the footprint of the mesa and then etching to the required layer. Enhanced etch selectivity can be achieved by adding a small amount of Phosphorus to the N-type optical window layer; for instance the composition can be changed from Al0.8Ga0.2As to Al0.8Ga0.2As1-xPx where X<approximately 0.1. This will result in a lattice mismatched structure. However, since the layer is relatively thin and is typically the last layer grown in the epitaxial reactor, the degradation in device performance should be minimal. Furthermore, the phosphorus will raise the band-gap of the N-type optical window layer thereby slightly increasing to blue light transmission of the combine window layer structure.

Figure 14:
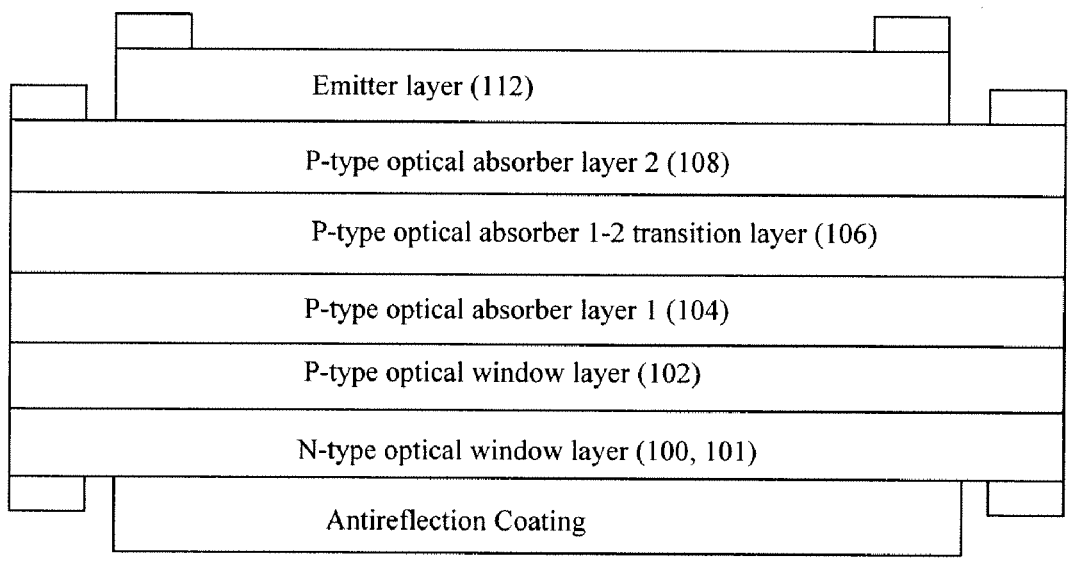
FIG. 14 shows a schematic cross section a nominal contact scheme for the Transferred Electron Photocathode embodiment.

It should be noted that the reverse biased junction could be applied to a Transferred Electron Photocathode almost as easily as to the previously described NEA photocathodes. Transferred electron photocathodes such as those described in U.S. Pat. Nos. 3,361,303, 5,047,821 and 5,576,559 contain a p-type optical absorber layer and a p-type optical window layer. These layers may be modified and engineered as described above to achieve an electrically alterable spectral response. The main difference is that a third contact would be required to service the Schottky contact on the vacuum-facing surface of the Emitter layer. The nominal contact scheme is shown schematically in FIG. 14. Once again the contacts are placed around the periphery in order to leave a large unobstructed active area on the photocathode. As these photocathodes are often grown as lattice-matched structures of InGaAsP and InGaAs on InP substrates, an n-type InP substrate can provide physical support for the cathode and constitute the n-type optical window layer. Consequently, the n-type ohmic contact to the window layer can be made on back surface of the substrate in an area where there is no anti-reflection coating. A potential layer structure for a TE photocathode incorporating an electrically alterable spectral response is described in Table 2 which starts on this page and is completed on the next page.

TABLE 2

| Layer Number | Composition | Doping #/cm$^3$ | Thickness Microns | Layer Title/ Function |
|---|---|---|---|---|
| 1 (100) | InP | n-type, $1 \times 10^{16}$ | 400 | n-type optical window layer (substrate) |
| 2 (101) | InP | n-type, $1 \times 10^{18}$ | 0.2 | n-type optical window layer (Buffer layer) |
| 3 (102) | InP | p-type, $1 \times 10^{16}$ | 0.45 | p-type optical window layer |
| 4 (104) | 1.4 micron band-gap, lattice matched InGaAsP | p-type, $1 \times 10^{16}$ | 0.5 | p-type optical absorber layer 1 |
| 5 (106) | Ramp from layer 4 composition to layer 5 composition | p-type, $1 \times 10^{16}$ Ramp to P-type, $7 \times 10^{17}$ | 0.1 | p-type optical absorber 1-2 transition layer |
| 6 (108) | 1.65 micron band-gap, lattice matched InGaAs | p-type, $7 \times 10^{17}$ | 1.5 | p-type optical absorber layer 2 |
| 7 (110) | As described in U.S. Pat. No. 5,576,559 | | | Absorber-Emitter transition layer |
| 8 (112) | InP | Un-doped | 0.5 | Emitter layer |

In all of the specified embodiments there is a p-type optical window layer. A junction is formed between an n-type optical window layer or a surface Schottky barrier layer. It should be noted that an un-doped, compensated or intrinsic optical window layer can be introduced between the n and p-type layers or between the Schottky and p-type optical window layer. This structure is functionally equivalent to the previous described embodiments. This additional layer would tend to lower junction capacitance but raise the required reverse bias voltage. Incorporation of such a layer is envisioned as part of the photocathode in this specification and should simply be considered as a degree of freedom that a designer may use to engineer a photocathode with specific properties. The layer itself for example would appear as a sixth layer in Table 1, a seventh layer in the photocathode described in Table 2 and a seventh layer in the photocathode described in connection with Table 3.

It should be noted that if the spectral distribution of the object being viewed falls within the spectral range that is "turned off" when the reverse bias voltage is applied, the invention can be used as an electronic shutter. If fact, if the central area of the optical absorber layer of the photocathode is thinned with respect to an annular contact overlying a thicker optical absorber layer, it is possible to design a cathode in which the entire illuminated area of the optical absorber layer can be depleted when the rectifying junction is placed in its reverse biased state. A cathode of this type will exhibit a very high extinction ratio. In other words, the QE or response of the cathode in its "on" or unbiased state can be an order of magnitude or more greater than its response in its "off" or reverse biased state. In a properly designed cathode, this switching or gating could occur very quickly. The high doping in layer 5 allows the cathode to achieve good escape probability after the work function of the surface is lowered. The lower doping in layer 4 allows full depletion at reasonable reverse bias voltages. The fact that the doping increases between layer 4 and layer 5 will introduce a small but significant (~4 kT at 300K) conduction band barrier to the photoelectrons residing in layer 4. However, at a doping level of $1 \times 10^{17}$, the electron lifetime should be sufficient to allow a high fraction of the photo-generated electrons to eventually escape over the barrier at temperatures of ~300K.

TABLE 3

| Layer Number | Composition | Doping #/cm$^3$ | Thickness Microns | Layer Title/Function |
|---|---|---|---|---|
| 1 | Al$_{0.8}$Ga$_{0.2}$As | n-type, $1 \times 10^{19}$ | 2.0 | n-type optical window layer |
| 2 | Al$_{0.8}$Ga$_{0.2}$As | p-type, $1 \times 10^{16}$ | 0.4 | p-type optical window layer 1 |
| 3 | Al$_{0.8}$Ga$_{0.2}$As linear ramp to GaAs | p-type, $1 \times 10^{17}$ | 0.02 | p-type optical window layer 2 |
| 4 | GaAs | p-type, $1 \times 10^{17}$ | 0.15 | p-type optical absorber layer 1 |
| 5 | GaAs | p-type, $7 \times 10^{18}$ | 0.02 | p-type optical absorber layer 2 |
| 6 | Al$_{0.2}$Ga$_{0.8}$As | p-type, $1 \times 10^{19}$ | 0.1 | p-type contact buffer layer |

Table 3 details a structure that could be used for a photocathode that is designed to turn off with a high extinction ratio. Layer 5, the p-type contact buffer layer will be removed everywhere except directly below the p-type ohmic contact. It should further be noted that the p-type ohmic contact may tale the form of an annular contact with an open central active photosensitive region or even an annular ring filled with a gridded contact area that overlies the active photosensitive region. Although the photoresponse of the photocathode would be somewhat reduced in the gridded area, the RC time constant of the photocathode would be reduced thereby reducing switching time. Similarly, a metal grid overlying an ohmic contact could be employed over the full active area on the n-type optical window layer.

It should also be noted that the ohmic contacts and the metal overlying the ohmic contacts could be patterned to form constant impedance "microwave" strip-lines thereby allowing RF energy to propagate along the surface of the cathode while simultaneously affecting the optical response of the cathode.

It should be noted that when the biased hetero-junction (BH) photocathode is run in the reverse-biased state, the reverse-biased portion of the photocathode is in essence a solid-state optical detector. The current flowing through the contacts of the reverse-biased detector will be the sum of the junction's leakage current plus the photocurrent generated in or collected by the depletion region of the rectifying junction. In the case of the BH photocathode that employs a n-p semiconductor homo-junction, the leakage current can be quite small. Consequently, the BH photocathode can be considered a high quality semiconductor optical detector when used in its reverse biased state.

The realization that the invention is, in it's own right, a high quality solid state optical detector leads to another potential application of the BH photocathode. Solid-state optical detectors are typically used to detect and quantify moderate to high light levels. PMTs are typically used to detect and quantify low to extremely low light levels. A PMT that uses the BH photocathode incorporates the ability to detect light both via its anode after the electrons emitted from the cathode are multiplied and directly via the current flowing through the reverse-biased BH photocathode. The spectral response of these two detective modes may vary. However, if required, band-gap engineering and spectral filtering can be used to level the response of the two detective modes. In this case, one can design a hybrid, semiconductor/PMT optical detector that combines the ability to detect and quantify light ranging from very high light levels down to very faint light levels. In operation, the PMT would be operated and monitored at low light levels with the photocathode in its unbiased state. At high light levels, the PMT would be turned off, the BH photocathode switched into its reverse biased mode and the rectifying junction current would be monitored in order to determine and quantify the light level. For a GaAs based BH photocathode based hybrid PMT, one can fairly easily design a sensor module that could detect and quantify light levels ranging from ~1 W/cm$^2$ to ~$10^{-14}$ W/cm$^2$. This represents a dynamic range of 14 orders of magnitude. With detailed design work or cooling even greater dynamic ranges are possible.

Figure 15:
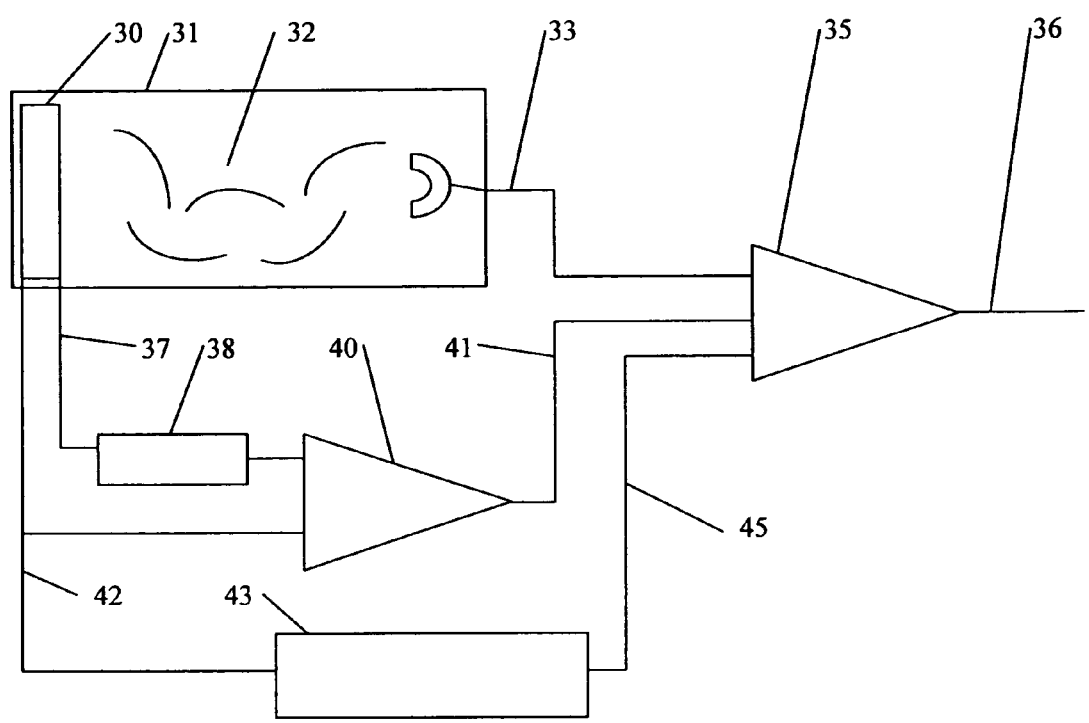
FIG. 15 schematically shows an embodiment of a high dynamic range biased hetero-junction photocathode, optical sensor module.

Referring now to FIG. 15, 30, the BH photocathode is at the heart of the hybrid PMT optical sensor. The hybrid PMT, 31, contains the BH photocathode, 30, an electron multiplier 32 and anode 33. When the hybrid PMT is in its low light level mode, the BH cathode 30 is in its unbiased state. High voltage is applied to the photocathode from the controllable high voltage bias supply, 43, via line 42. The multiplied signal is collected via line 33 and routed to unit 35. When the hybrid sensor unit is in its high light mode, the PMT bias is turned off, the BH photocathode is reverse biased. The photocathode is biased via lines 42 and 37 by unit 38, the controllable rectifying junction power supply. The current flowing through the rectifying junction is sensed and conditioned by unit 40. Unit 40 has the additional function of providing high voltage isolation between the photocathode assembly and the subsequent electronics represented by unit 35. Unit 35 has multiple functions. First, unit 35 collects and multiplexes both the PMT signal and that of the rectifying junction. Second, unit 35 controls both the PMT high voltage bias supply 43 and the rectifying junction bias supply 38. As part of this automatic gain control function, unit 35 may vary the voltage applied to the PMT continuously or to achieve several predetermined gain values. Thirdly, unit 35 performs any required signal conditioning before supplying an output signal on line 36. Ideally, for low bandwidth applications, line 36 represents a digital output bus with a signal that is linearly proportional to the input light level over the full dynamic range of the sensor. Similarly, line 36 could be composed of both a digital bus that reports system gain and an AC coupled line with analog signal.

While this invention has been discussed in terms of exemplary embodiments of specific materials, doping and applications it should be understood by those skilled in the art that variations of these specific examples may be made and/or used and that such structures and methods will follow from the understanding imparted by the practices described and illustrated as well as the discussions of operations as to facilitate modifications that may be made without departing from the scope of the invention defined by the appended claims.

The invention claimed is:

1. A semiconductor photocathode comprising:
a hetero-junction between a p-type optical window layer and a p-type optical absorber layer in which said hetero-junction has a conduction band barrier in excess of 3 kT, and an n-type optical window layer overlying the p-type optical window layer, and in which said hetero-junction is created between said p-type optical window layer and said p-type optical absorber layer, the interface of the n-type optical window layer and the p-type optical window layer forming a rectifying junction, and
electrical connections to said photocathode to create an electric field across said hetero-junction to remove said barrier,
wherein the p-type optical absorber layer comprises a first optical absorber layer which is lightly doped and a second optical absorber layer which is heavily doped.

2. A hetero-junction semiconductor photocathode in accordance with claim 1 in which an n-type ohmic contact is made to the n-type optical window layer and a p-type ohmic contact is made to the p-type optical absorber layer.

3. A hetero-junction semiconductor photocathode in accordance with claim 2 in which the thickness and doping of the p-type optical window layer is such that when no bias is applied across the rectifying junction, at least on the order of 100 Angstroms of the p-type optical window layer remains undepleted.

4. A hetero-junction semiconductor photocathode in accordance with claim 1 in which said n-type optical window layer comprises a transparent substrate of a TE photocathode.

5. A hetero-junction semiconductor in accordance with claim 1 in which the n-type optical window layer comprises an n-type AlGaAs.

6. A hetero-junction semiconductor in accordance with claim 1 in which said second p-type optical absorber layer overlies said first p-type optical absorber layer which in turn overlies said p-type optical window layer overlying said rectifying junction.

7. A hetero-junction semiconductor in accordance with claim 6 in which said second p-type optical absorber layer comprises GaAs.

8. The photocathode structure of claim 1 in which said n-type optical window layer is positioned overlying an antireflection coating and said antireflection coating overlies a glass support layer.

9. A negative electron affinity photocathode comprising a glass support window, an antireflection coating on the surface of said window, an n-type optical window layer on said antireflection coating, a p-type optical window layer on said n-type optical window layer, a p-type optical window layer to optical absorber layer transition layer on said p-type optical window layer, a first p-type optical absorber layer on said p-type transition layer, and a p-type optical absorber 1 to 2 transition layer on said first p-type optical absorber layer, and a second p-type optical absorber layer on said p-type optical absorber 1 to 2 ransition layer, and electrical ohmic contacts on open surface areas of said second p-type optical absorber layer and on open surfaces of said n-type optical window layer, wherein the first p-type optical absorber layer is lightly doped and the second p-type optical absorber layer is heavily doped, wherein a hetero-junction is created between the p-type optical window layer and the first p-type optical absorber layer, and wherein a rectifying junction is formed between the n-type optical window layer and the first p-type optical window layer, and in said hetero-junction there is a conduction band barrier in excess of 3 kT; and
electrical connections through said electrical ohmic contacts to said photocathode to create an electric field across said hetero-junction to remove said barrier.

10. The photocathode of claim 9 in which the electrical ohmic contact on the open surfaces of said second p-type optical absorber layer comprise a p-type ohmic contacts.

11. The photocathode layer of claim 9 in which the electrical ohmic contact on said n-type optical window layer comprises an n-type ohmic contact.

12. A transferred electron photocathode incorporating an electrically alterable photoresponse comprising an antireflection coating layer, an n-type optical window layer overlying said antireflection coating layer, a p-type optical window layer overlying said n-type optical window layer, a first p-type optical absorber layer overlying said p-type optical window layer, an optical absorber p-type 1 to 2 transition layer overlying said first p-type optical absorber layer, a second p-type optical absorber layer overlying said p-type 1 to 2 transition layer, and an emitter layer overlying said second p-type optical absorber layer, two electrical contacts independently placed around the periphery of said n-type optical window layer and said second p-type optical absorber layer, and a third electrical contact to service the Schottky contact on the surface of said emitter layer, wherein the first p-type optical absorber layer is lightly doped and the second p-type optical absorber layer is heavily doped, wherein a hetero-junction is created between the p-type optical window layer and the first p-type optical absorber layer and wherein a rectifying junction is formed between the n-type optical window layer and the first p-type optical window layer, and in said hetero-junction there is a conduction band barrier in excess of 3 kT; and
electrical connections through said two electrical contacts to said photocathode to create an electric field across said hetero-junction to remove said barrier.

13. A flow cytometry system comprising a photomultiplier tube with a two color photocathode, a supply station to introduce and regulate a suspension to be tested, an examination tube connected to said supply station to flow suspension from said supply station therethrough, a light source to illuminate a small section of said examination tube, and collection optics to receive scattered or emitted light from a sample flowing in said examination tube and project said light into said photomultiplier tube for analysis, wherein the two color photocathode comprises:
a hetero-junction between a p-type optical window layer and a p-type optical absorber layer in which said hetero-junction has a conduction band barrier in excess of 3 kT, and an n-type optical window layer overlying the p-type optical window layer, and in which said hetero-junction is created between said p-type optical window layer and said p-type optical absorber layer, the interface of the n-type optical window layer and the p-type optical window layer forming a rectifying junction, and
electrical connections to said photocathode to create an electric field across said hetero-junction to remove said barrier,
wherein the p-type optical absorber layer comprises a first optical absorber layer which is lightly doped and a second optical absorber layer which is heavily doped.

14. A night vision system comprising a semiconductor photocathode comprising a hetero-junction between a p-type optical window layer and a p-type optical absorber layer in which said hetero-junction has a conduction band barrier in excess of 3 kT, and an n-type optical window layer overlying the p-type optical window layer, and in which said hetero-junction is created between said p-type optical window layer and said p-type optical absorber layer, the interface of the n-type optical window layer and the p-type optical window layer forming a rectifying junction, wherein the p-type optical absorber layer comprises a first optical absorber layer which is lightly doped and a second optical absorber layer which is heavily doped, electrical connections across said hetero-junction to create an electric field across said hetero-junction to remove said barrier, and light collection optics to create an image on the input surface of said photocathode, an electron gain stage to amplify the signal output from said photocathode to form visual or electrical images conforming to low light level images received by said photocathode.

15. A night vision system in accordance with claim 14 including thermal imaging elements and processing electronics to merge the thermal image with the low light image for combined viewing.

16. A night vision system comprising a binocular arrangement including a semiconductor photocathode comprising a hetero-junction between a p-type optical window layer and a p-type optical absorber layer in which said hetero-junction has a conduction band barrier in excess of 3 kT, and an n-type optical window layer overlying the p-type optical window layer, and in which said hetero-junction is created between said p-type optical window layer and said p-type optical absorber layer, the interface of the n-type optical window layer and the p-type optical window layer forming a rectifying junction, wherein the p-type optical absorber layer comprises a first optical absorber layer which is lightly doped and a second optical absorber layer which is heavily doped, electrical connections to create a field across said hetero-junction to remove said barrier, and light collection optics to feed the input received by said photocathode into an electron gain stage to form visual or electrical images conforming to low light images received by said photocathode.

17. A hetero-junction semiconductor TE photocathode comprising a first n-type optical window layer as a substrate layer, a second n-type optical window layer as a buffer layer, and p-type optical window layer, a rectifying junction formed between said n-type optical window layer and p-type optical window layer, a first p-type optical absorber layer, a p-type optical absorber 1-2 transition layer, a second p-type optical absorber layer, an absorber-emitter transition layer and an emitter layer, wherein the first p-type optical absorber layer is lightly doped and the second p-type optical absorber layer is heavily doped, wherein a hetero-junction is created between the p-type optical window layer and the first p-type optical absorber layer, and in which said hetero-junction has a conduction band barrier in excess of 3 kT; and electrical connections to said photocathode to create an electric field across said hetero junction to remove said barrier.

18. A hetero-junction semiconductor TE photocathode in accordance with claim 17 further including an ohmic contact on the surface of said first n-type optical window and an ohmic contact on an exposed surface of said second p-type optical absorber layer.

19. A hetero-junction semiconductor TE photocathode in accordance with claim 18 further including a Schottky contact on the surface of the emitter layer.

20. A hetero-junction semiconductor TE photocathode in accordance with claim 19 in which said contacts are placed around the periphery to maintain large unobstructed active areas on said photocathode.

21. A hetero-junction semiconductor TE photocathode in accordance with claim 17 in which said substrate layer comprises InP and in which said buffer layer comprises a very thin layer of InP.

22. A hetero-junction semiconductor TE photocathode in accordance with claim 17 in which said p-type optical window layer comprises InP and in which said first p-type optical absorber layer comprises InGaAsP.

23. A hetero-junction semiconductor TE photocathode in accordance with claim 22 in which said emitter layer comprises InP doped to <5E16 dopant atoms per cubic cm.

24. A hetero-junction semiconductor photocathode with a high extinction ratio comprising an n-type optical window layer, a first p-type optical window layer, a second p-type optical window layer, a first p-type optical absorber layer that is lightly doped, a second very thin p-type optical absorber layer that is heavily doped, and a p-type contact buffer layer, wherein a hetero-junction is created between the second p-type optical window layer and the first p-type optical absorber layer and wherein a rectifying junction is formed between the n-type optical window layer and the first p-type optical window layer, and in said hetero-junction there is a conduction band barrier in excess of 3 kT; and electrical connections to said photocathode to create an electric field across said hetero junction to remove said barrier.

* * * * *